United States Patent
Mueck et al.

(10) Patent No.: US 7,432,844 B2
(45) Date of Patent: Oct. 7, 2008

(54) DIFFERENTIAL INPUT SUCCESSIVE APPROXIMATION ANALOG TO DIGITAL CONVERTER WITH COMMON MODE REJECTION

(75) Inventors: Michael Mueck, Andover, MA (US);
Michael Christian Wohnsen Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/633,368

(22) Filed: Dec. 4, 2006

(65) Prior Publication Data

US 2008/0129573 A1  Jun. 5, 2008

(51) Int. Cl.
*H03M 7/46* (2006.01)

(52) U.S. Cl. .............................. 341/163; 341/161
(58) Field of Classification Search ................ 341/155, 341/163, 144, 118, 120, 161
See application file for complete search history.

(56) References Cited

U.S. PATENT DOCUMENTS

| | | | | |
|---|---|---|---|---|
| 4,620,179 | A | 10/1986 | Cooper et al. | |
| 6,437,608 | B1 * | 8/2002 | Miyabe et al. | ................ 327/96 |
| 6,667,702 | B2 | 12/2003 | Sasaki et al. | |
| 6,667,707 | B2 | 12/2003 | Mueck et al. | |
| 6,724,248 | B2 * | 4/2004 | Llewellyn | ...................... 330/9 |
| 6,933,762 | B2 * | 8/2005 | Ono | ........................... 327/307 |
| 7,180,354 | B2 * | 2/2007 | Gabillard et al. | ........... 327/307 |

OTHER PUBLICATIONS

Bacrania, K., "Digital Error Correction to Increase Speed of Successive Approximation", IEEE ISSCC vol. 29, pp. 140-141, Feb. 1986.
PCT/US2007/019022 International Search Report and Written Opinion, Mar. 6, 2008.

* cited by examiner

*Primary Examiner*—Brian Young
(74) *Attorney, Agent, or Firm*—Wolf, Greenfield & Sacks, P.C.

(57) ABSTRACT

A Successive Approximation Routine converter is provided in which a comparator is responsive to an output of a first Digital to Analog Converter, and an output of a second Digital to Analog Converter and to a DAC common mode output reference voltage, and wherein the comparator provides data to a SAR controller indicating which one of the DAC outputs is greater than the other, and how a common mode voltage on the DAC outputs compares to the reference voltage. On this basis the SAR controller can add or subtract a common mode offset to the trial words being presented at a given bit trial such that both differential and common mode convergence is achieved.

30 Claims, 7 Drawing Sheets

PREFERRED EMBODIMENT

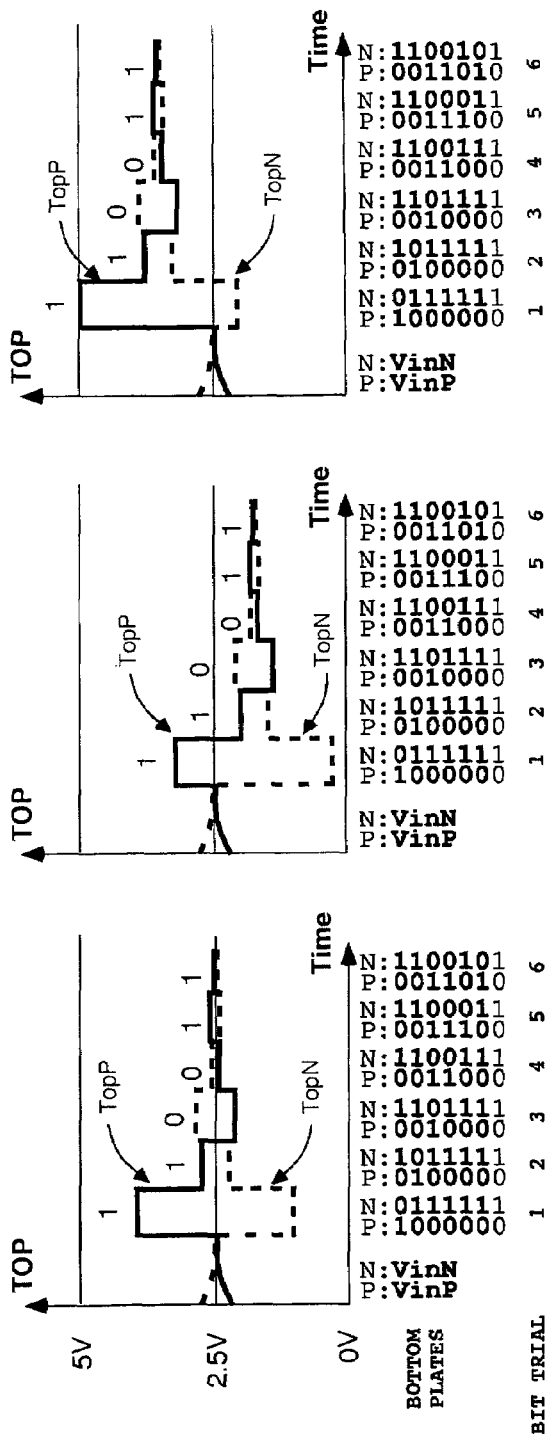

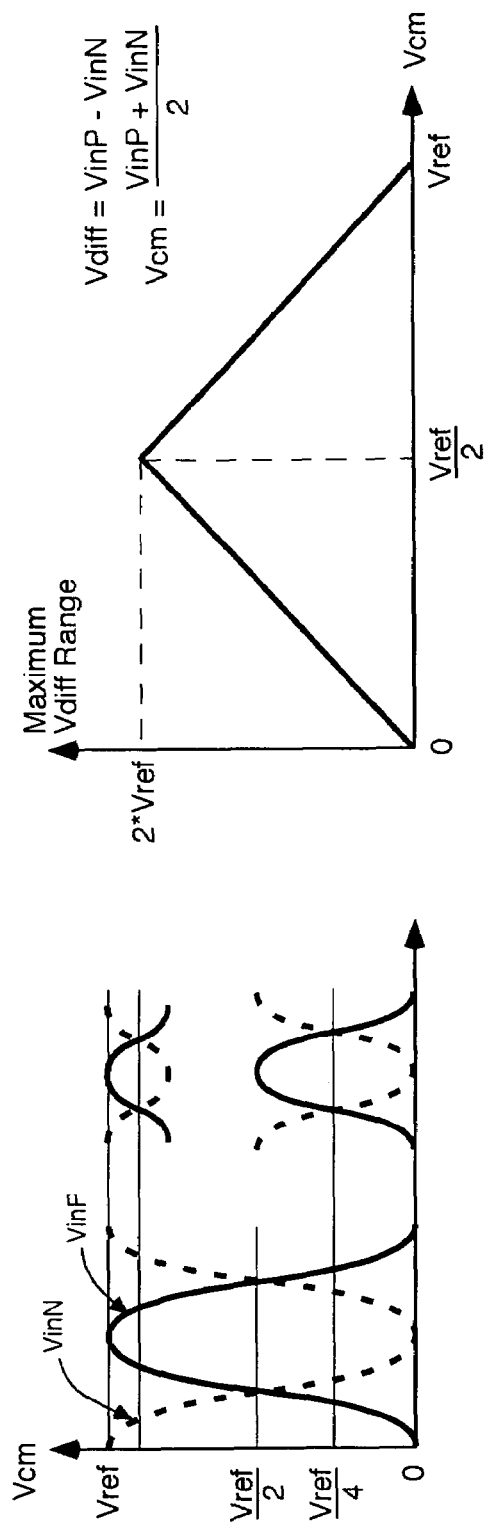
FIG 3: MAXIMUM DIFFERENTIAL INPUT RANGE vs COMMON MODE VOLTAGE

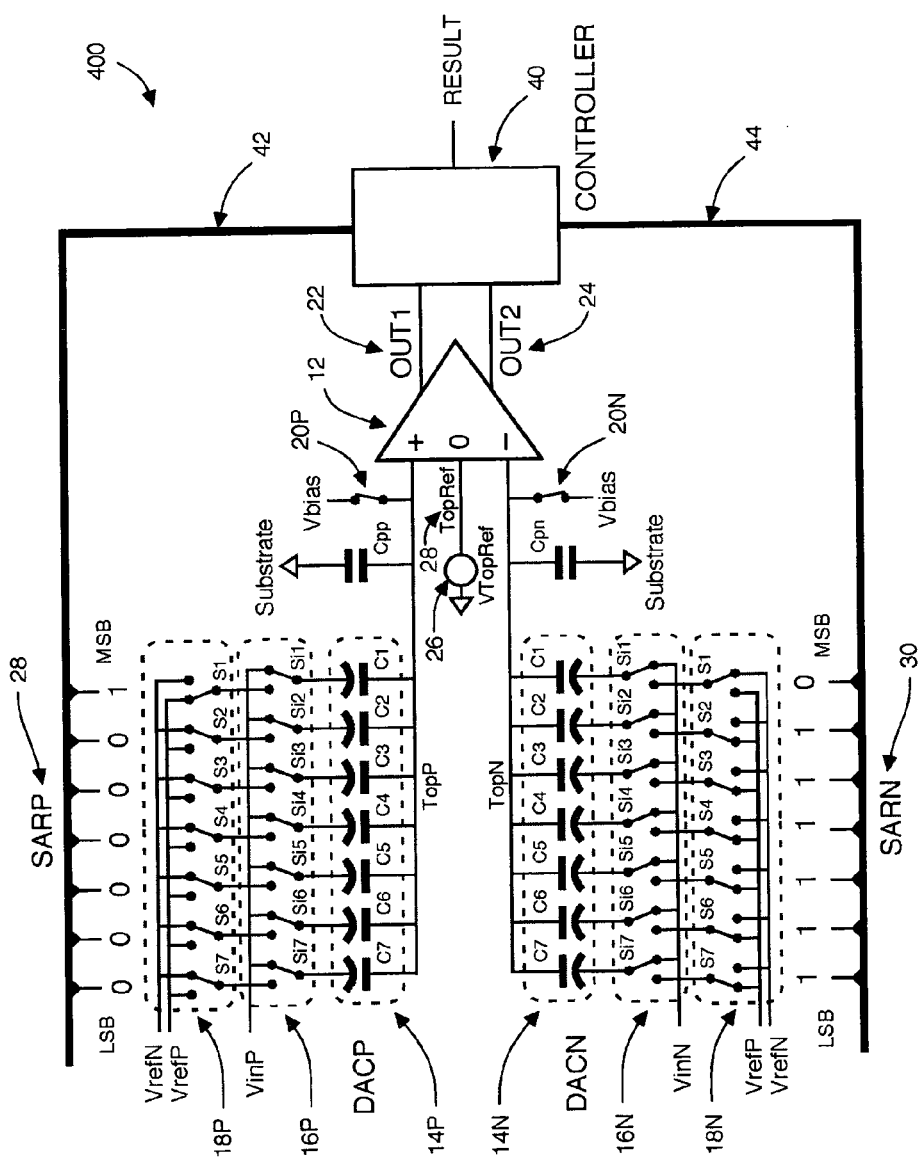
FIG. 4 PREFERRED EMBODIMENT

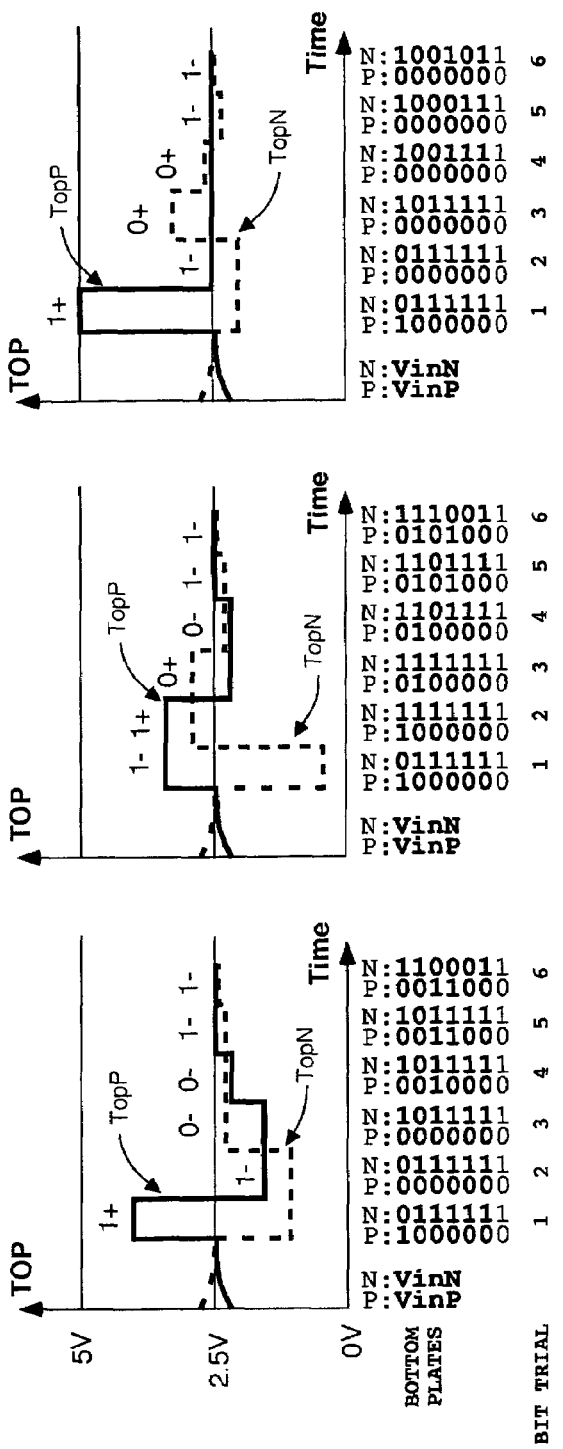

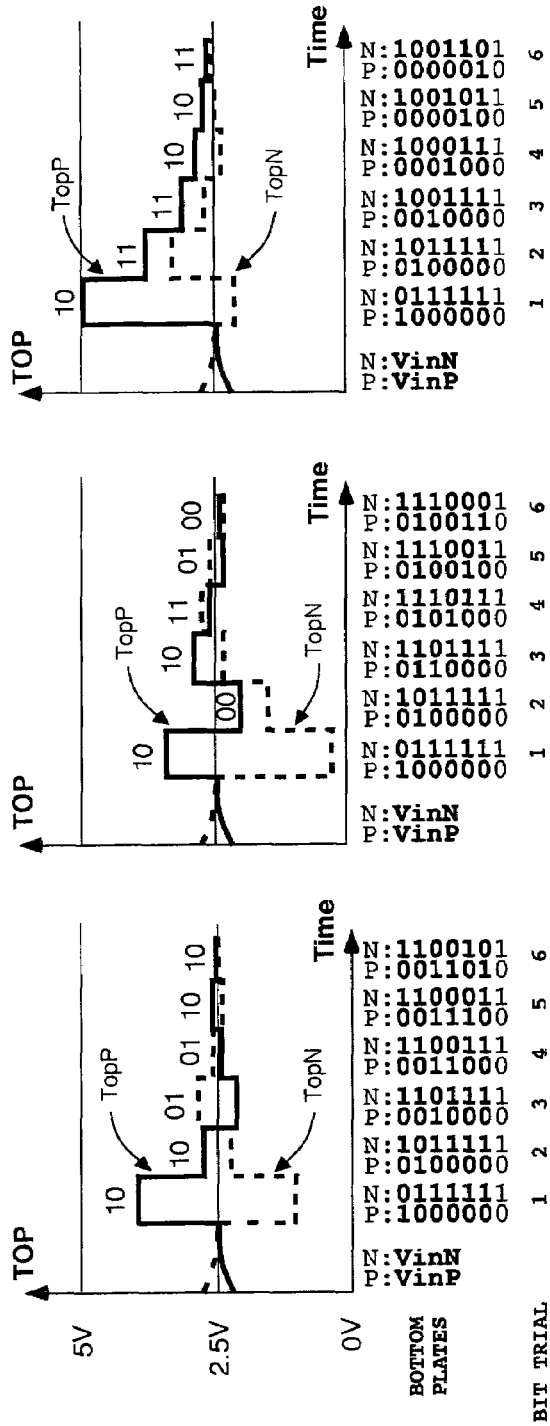

FIG 7: PREFERRED EMBODIMENT COMPARATOR EXAMPLES

THREE REGULAR COMPARATORS

TWO REGULAR COMPARATORS

CUSTOM CIRCUIT

TWO REGULAR COMPARATORS WITH INTERNALLY GENERATED TOPREF VOLTAGE

TWO REGULAR COMPARATORS WITH TOP-P, TOP-N AVERAGING CIRCUIT

DIFFERENTIAL INPUT SUCCESSIVE APPROXIMATION ANALOG TO DIGITAL CONVERTER WITH COMMON MODE REJECTION

FIELD OF THE INVENTION

The present invention relates to a differential switched capacitor successive approximation analog to digital converter that exhibits enhanced immunity to common mode signals.

BACKGROUND OF THE INVENTION

Switched capacitor, charge redistribution successive approximation routine (SAR) analog to digital converters (ADCs) are commonplace. Such converters provide good resolution in combination with the ability to asynchronously sample an input signal and to output their answers without incurring a pipeline delay overhead. Presently, such converters can accept differential inputs and accurately convert those inputs into digital form provided the common mode component of the input is fixed at a value required by the converter. This is typically accomplished through external circuitry such as an operational amplifier or instrumentation amplifier circuit which can translate the input common mode component to the value required by the converter for accurate operation. However these circuits can introduce noise or gain error, and consume power and space, and are best avoided if possible.

A prior art differential input, charge redistribution 6-bit (for simplicity only) SAR ADC is shown in FIG. 1. It samples a pair of input voltages, VinP and VinN, with respect to a bias voltage, Vbias, and, under the control of a SAR controller, produces a sequence of binary decisions at the output, OUT, which correspond to the digital equivalent of the input voltage difference with respect to the reference voltage difference, (VrefP−VrefN).

The SAR ADC system 100 shown comprises two digital-to-analog converters (DACs), DACP and DACN, a comparator 12, and an SAR controller/engine 40 to drive the DACs. Each DAC comprises (for this example) a 6-bit binary-weighted capacitor array 14P, 14N, where the total capacitance of each individual array 14P, 14N is C. The DACs further comprise two corresponding sets of switches 16P, 16N to connect the respective DAC inputs to VinP/N, and corresponding sets of switches 18P, 18N to connect the respective DAC inputs to VrefP/N (as appropriate), as well as switches 20P, 20N to connect the DAC outputs, TopP, TopN, to the bias voltage point, Vbias, which is an arbitrary but constant voltage typically mid-way between the comparator's input range or the power supply voltages VDD and GND.

In the example shown in FIG. 1, each of the weighted capacitor arrays 14N (associated with DACN) and 14P (associated with DACP) includes capacitors C1, C2, C3, C4, C5, C6 and terminating capacitor C7. The capacitances of such capacitors, with respect to the total capacitance C of the array, is as follows: $C1=C/2$, $C2=C/4$, $C3=C/8$, $C4=C/16$, $C5=C/32$, $C6=C/64$ and $C7=C6=C/64$. The sum of the capacitances of C1 to C7 equals C. In real world implementations of this circuit, additional detrimental parasitic capacitors will exist, and these have, for convenience, been shown as extending from the common rail TopP to ground and from the common rail TopN to ground and have been designated $C_{pp}$ and $C_{pn}$ respectively.

Each of switch sets 16N (associated with DACN) and 16P (associated with DACP) includes switches Si1, Si2, Si3, Si4, Si5, Si6 and Si7. Each of switch sets 18N (associated with DACN) and 18P (associated with DACP) includes switches S1, S2, S3, S4, S5, S6 and S7.

The DAC outputs TopP and TopN provide input voltages to the comparator 12. The plates of the capacitors directly connected to the outputs TopP and TopN are referred to as the "top plates" with the other capacitor plates referred to as the "bottom plates." The switches to Vbias are referred to as the "top-plate switches" 20P and 20N.

During operation, an input voltage is sampled as charge across the input capacitors with the DAC bottom plates connected to the input voltages VinP and VinN through switches in the switch sets 16P and 16N. When the top-plate switches 20P and 20N are closed, the DAC is said to be "sampling the input", and at the instant at which the top plate switches open, the DAC is said to have "taken the sample".

After sampling the input voltage, the ADC 100 carries out an iterative process, referred to as a successive approximation routine (SAR). Using the P-side of the circuit as an example, the SAR iterative process begins by connecting in turn the bottom plate of each of the capacitor array 14P capacitors C1 . . . C7, through its corresponding switch Si1 . . . Si7 in switch bank 16P and a corresponding switch S1 . . . S7 in switch bank 18P, to either the positive reference voltage VrefP or the negative reference voltage VrefN. Each capacitor, e.g. C4, represents one of the bits in the digital output word of the ADC 100, the most significant (MSB) of which corresponds to capacitor C1 and the least significant bit (LSB) of which corresponds to capacitor C6.

In an exemplary embodiment, a bit has a binary value of 1 when the bottom plate of the associated capacitor, e.g. C1, is connected to the positive reference voltage Vrefp and the bit has a binary value of 0 when the bottom plate of the capacitor, e.g. C4, is connected to the negative reference voltage VrefN through switch bank 18. In this example, switch Si4 would get switched to connect capacitor C4 to the Vref voltages (i.e. not the VinP position) and switch S4 would get aligned to connect capacitor C4 to either VrefP or VrefN, depending on whether C4 was to represent a logical 1 or 0, respectively.

As those skilled in the art will appreciate the SAR controller will step through such a series of SAR iterations, starting with the MSB capacitor and ending with the LSB capacitor. During each iteration, each capacitor is switched to either VrefP or VrefN such that the top plate voltages, TopP and TopN, converge with each iteration. When the iterations have completed, the last-used digital word (the value of the bits to which the capacitors were connected) is selected as the output of the ADC.

FIGS. 2A-C show an aspect of the differential operation of the ADC 100 of FIG. 1. FIGS. 2A-C, and all subsequent similar figures, depict the top plate voltages TopP and TopN as a function of time. During the time interval depicted, the bottom plate voltages are initially connected to their respective VinP and VinN inputs in the sampling phase. During this time the top plate voltages settle towards Vbias due to the closure of the sampling switches 20P and 20N. Next the sampling switches are opened, thus sampling the inputs, and the bottom plates are switched to the SAR controller and a succession of digital words are presented to the DACs during the conversion process. The SAR words presented to the SARP and SARN switches for bit trial #1 are SARP=1000000 and SARN=0111111 where the bus contents from left to right represent assignments from the MSB capacitor (C1) to the LSB capacitor (C6) and finally the terminating capacitor (C7). The progression of the SAR words from bit trial #1 to bit trial #6 with each successive approximation is a function of the analog input sampled.

In FIGS. 2A-C, and all subsequent similar figures, the positive reference voltage, VrefP, is 5V, and the negative reference voltage, VrefN, is 0V, with the corresponding restriction that each input is valid only between 0V and 5V. The Full Scale Range (FSR) of the converter is the difference between the maximum differential input, Vdiff_max, and the minimum differential input, Vdiff_min, according to:

Vref=VrefP−VrefN=5−0=5V

Vdiff_max=VinP_max−VinN_min=Vref−0=5V

Vdiff_min=VinP_min−VinN_max=0−Vref=−5V

FSR=Vdiff_max−Vdiff_min=Vref−−Vref=10V

In each of these figures the Vbias voltage is 2.5V and the applied differential input voltage is 0.3*FSR, or 3V. As this patent relates to the ability to accommodate varying common mode voltages, the set of three graphs within each figure vary only by the common mode voltage associated with the differential input voltage. This differential input voltage corresponds to an ideal ADC conversion result, from MSB to LSB, of "001100" on SARP and "110011 . . . " on SARN. The differential relationship between the top plates at each bit trial, i.e. is TopP>TopN, is shown above the top plate waveforms as either a 1 or 0. This 1 or 0 will also be the output provided by the comparator at the end of each bit trial. If the comparator output is 1, i.e. TopP is greater than TopN, then TopP is decreased by subtracting the bit weight under trial from SARP and TopN is increased by adding the bit weight under trial to SARN (also known as discarding the bit weight under trial). If the comparator output is 0, i.e. TopP is less than TopN, then the bit weight under trial in both SARP and SARN is left unaltered (also known as keeping the bit weight under trial). The next bit trial then begins by asserting the bit weight being trialled in SARP and de-asserting the bit weight being trialled in SARN. Those skilled in the art will appreciate the consequential convergence of the top plate voltages and also the fact that the SARP and SARN busses are related to each other—in this case they are complements of each other. Thus, in this example the 6 bit output from the comparator was 110011, and the conversion result is the inverse of this, namely 001100.

FIG. 2A shows the progress of the conversion with the input common mode voltage, Vcm, set to 2.5V. It is important to appreciate that when the sample was taken both top plate voltages were essentially equal to Vbias, and that upon the completion of the conversion both top plates had returned to that same voltage. The previously mentioned parasitic capacitors, Cpp and Cpn, therefore remain unchanged in their voltage. This represents a "return-to-zero" condition whereby any top plate parasitic capacitances, either linear or non-linear, which would otherwise corrupt the conversion process, are essentially in the same state as they were during sampling and, thus, have been prevented from contributing errors.

FIG. 2B similarly shows the progress of the conversion but with the input common mode voltage, Vcm, increased from 2.5V to 3V. The SAR controller, which only monitors the difference between the top plates, will act identically to FIG. 2A. However one skilled in the art will immediately appreciate that the top plates no longer 'return to zero' (i.e. Vbias) and that the deleterious top plate parasitic capacitors have been charged to a value which is a function of the different common mode voltage, Vcm. This charge was 'stolen' from the sampled input charge and the SAR algorithm, unaware of this missing charge, is likely to yield errors if the effect is large enough or if the accuracy called for is high enough.

FIG. 2C similarly shows the progress of the conversion but with the input common mode voltage decreased to 1.5V, yielding correspondingly similar errors as with FIG. 2B.

It can be thus seen that allowing the input common mode voltage, Vcm, to vary will limit the accuracy of the converter. However, real world input signals frequently have variable common mode voltages. While it is possible to circumvent this through external circuitry, it is desirable to have the converter perform this function without the need for such circuitry.

SUMMARY OF THE INVENTION

According to a first aspect of the present invention there is provided a Successive Approximation Routine (SAR) Analog to Digital Converter (ADC) having first and second Digital to Analog Converters (DAC) connected to a comparator, and a controller responsive to one or more outputs of the comparator for controlling trial words presented to the first and second DACs, and wherein the comparator is arranged to compare outputs of the first and second DACs or an average thereof with a common mode output reference and the controller is adapted to apply a common mode offset to the DAC trial words in response to the comparator.

According to a second aspect of the present invention there is provided a SAR ADC having first and second DACs, a controller for controlling trial words presented to the DACs, and wherein a comparator is provided to compare each DAC output with respect to a reference and the controller is adapted to perform differential modification of the DAC trial words when the reference is intermediate the DAC output values and to perform common mode modification of the DAC trial words when the reference is not intermediate the DAC output values.

According to a third aspect of the present invention there is provided a comparator for use in a SAR ADC the comparator having a first input for connection to an output of a first DAC, a second input for connection to an output of a second DAC and a third input for connection to a DAC output common mode reference voltage, and first and second outputs, wherein the comparator is adapted to compare a voltage at the first input with a voltage at the second input and to output the result of the comparison at the first output, and to compare a voltage at the third input with an average of the voltages at the first and second inputs and to output the result of the comparison at the second output.

The comparator may have two outputs so as, for example, to indicate two outputs TopP>TopN and (TopP+TopN)/2>Vbias, or three outputs TopP>TopN and TopP>Vbias and TopN>Vbias, or other equivalent outputs yielding similar information. This information can be used by a modified SAR controller to output independent SARP and SARN busses, i.e. such that the busses are not necessarily complements of one another, whereby with each SAR iteration the difference between these two busses provides differential convergence of the top plates and the sum of the two busses provides common mode convergence of the top plates towards the top plate voltage present at the sampling instant.

According to a fourth aspect of the present invention there is provided a controller for a SAR ADC, wherein the controller is:

a) responsive to an input indicative of a comparison between a DAC output common mode reference voltage and a common mode voltage at outputs of the first and second DACs controlled by the controller;

or b) responsive to a comparison of an output voltage of a first DAC with respect to a DAC output common mode reference voltage and to an output of a second DAC with respect to the DAC output common mode reference voltage;

and on the basis of the comparisons either adds or subtracts an offset to control words used to control the output of the digital to analog converters.

According to a fifth aspect of the present invention there is provided a differential SAR ADC comprising:

a first DAC having an output node connected to a first input of a comparator;

a second DAC having an output node connected to a second input of a comparator; and a SAR conversion controller responsive to an output of the comparator, and adapted to control operation of the DACs, wherein a detector is provided to determine during at least one SAR bit trial which of the first and second DACs has the larger voltage difference between its output node and a DAC output common mode reference voltage, and the SAR controller is responsive to the detector and adapted to control the first and second DACs independently of one another, and keeps one of the first and second DACs unchanged for a bit trial based on the output of the detector at a preceding bit trial.

According to a sixth aspect of the present invention there is provided a method of performing an analog to digital conversion using a differential input SAR ADC having a first switched capacitor DAC array for sampling a signal at a first input of the converter and a second switched capacitor DAC array for sampling a signal at a second input of the converter, the method comprising advancing from an Nth trial to an (N+1)th trial by setting new DAC trial words, wherein the step of setting new DAC trial words comprises:

1) determining whether the bit weight trialled at the Nth trial is to be kept or to be discarded, a subsequent and 2) applying a common mode offset to the DAC trial words.

According to a seventh aspect of the invention there is provided a method of performing an analog to digital conversion using a differential input SAR ADC having a first switched capacitor DAC array connected to a first input of the converter and an output connected to a first input of a comparator and a second switched capacitor DAC array connected to a second input of the converter and an output connected to a second input of the comparator, said comparator further being responsive to a DAC output common mode reference voltage, the method comprising the steps of advancing from a Nth bit trial to an (N+1)th bit trial by:

a) determining at the Nth bit trial whether the Nth bit weight is to be kept or to be discarded;

b) determining at the Nth bit trial which of the first switched capacitor DAC array output and the second switched capacitor DAC array output has a largest magnitude voltage difference with respect to the DAC output common mode reference voltage;

c) and, for whichever array has the largest voltage difference with respect to the DAC output common mode reference voltage modifying the DAC trial word presented on that array for the (N+1)th bit trial while keeping the other array unaltered from the Nth bit trial.

According to a eighth aspect of the present invention there is provided a method of performing an analog to digital conversion using differential input SAR ADC having a first switched capacitor DAC array connected to a first input of the converter and a second switched capacitor DAC array connected to a second input of the converter, and where the first switched capacitor DAC array and second switched capacitor DAC array are connected to respective inputs of a comparator, and wherein during at least one SAR conversion a common mode offset is applied to the first and second switched capacitor DAC arrays, where the magnitude of the offset varies as a function of the bit trial weight.

It is thus possible to provide an arrangement where only one of the SAR busses, the one associated with the top plate voltage furthest from the top plate common mode reference input, is modified each SAR cycle.

BRIEF DESCRIPTION OF THE DRAWINGS

The present invention will further be described, by way of non-limiting example only, with reference to the accompanying drawings in which:

FIGS. 2A to 2C depict graphs illustrating relative top plate versus bottom plate voltages within the converter of FIG. 1 during various stages of a SAR conversion where the input signals have a fixed value differential input voltage and three different common mode voltages;

FIG. 3 is a graph illustrating the maximum differential input range versus the input common mode voltage;

FIG. 4 is a circuit diagram showing the configuration of a differential input SAR ADC constituting an embodiment of the present invention;

FIGS. 5A to 5C are graphs illustrating relative top plate versus bottom plate voltages within the converter of FIG. 4 during various stages of a SAR conversion where the input signals have the same fixed value differential input voltage and three different common mode voltages as shown in FIG. 2;

FIGS. 6a to 6c are graphs showing relative top plate voltages within the converter of FIG. 4, when operating in accordance with a further SAR algorithm constituting an embodiment of the present invention.

DESCRIPTION OF PREFERRED EMBODIMENTS OF THE INVENTION

Figure 1:
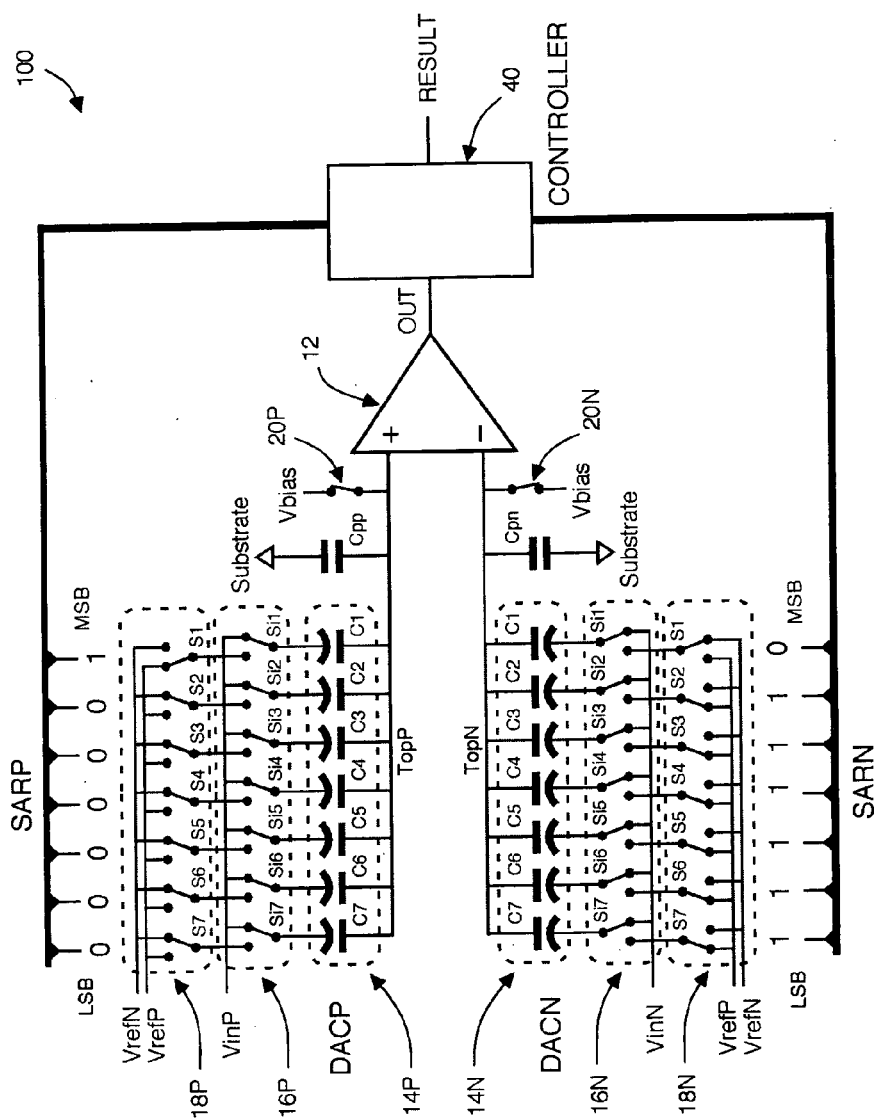
FIG. 1 is a circuit diagram showing a configuration of a prior art differential input switched capacitor SAR ADC.

Presently known charge redistribution, SAR differential input ADCs, as exemplified by FIG. 1, require an essentially fixed input common mode voltage for proper operation. The operation of such converters, including their common mode input voltage limitations, was discussed in detail in the BACKGROUND OF THE INVENTION section. Pertinent internal waveforms of such converters receiving an input having the proper common mode voltage are depicted in FIG. 2A and operation when receiving inputs having a common mode voltages outside the requirements of the ADC are depicted in FIGS. 2B and 2C. The general problem identified was related to the presence of parasitic capacitors at the internal DAC outputs coupled with the common mode voltage of the DAC outputs being sampled at one voltage, Vbias, and ending up at a different voltage at the end of the conversion.

This means that as the approximation finishes there will have been a charge transfer between the capacitor arrays and the parasitic capacitors corresponding to the product of the size of the nonlinear parasitic capacitors and the common mode voltage. The size of this transfer is unquantified and it may be greater than or less than the least significant bit weight being resolved by the ADC. This problem certainly becomes more significant as converter resolution increases. Importantly, we can see that for a given differential input, the output word will become dependent on the common mode input voltage, and this is clearly undesirable.

As noted earlier, in order to overcome this problem it is known to precede the differential ADC with an instrumentation amplifier exhibiting a high common mode rejection ratio, that has low, and preferably zero, common mode gain. However the inclusion of such an amplifier necessarily incurs a cost penalty, a power penalty, and may give rise to additional noise sources and may also give rise to a gain error.

The inventors have realised that the differential input ADC can be modified, and that a corresponding modification in the conversion algorithm be made, in order to enable the converter to be able to convert accurately, even in the presence of a varying common mode input voltage.

The key to facilitating the ADC to perform an accurate conversion is the realisation that the control words on the capacitor arrays need not be inexorably linked to one another, with the control word for the N array being the complement of the control word for the P array as is the case in the prior art, but that the arrays can be independently controlled. This enables the SAR algorithm to control the voltages TopP and TopN so as to reduce the difference between them, at least by the end of the conversion, so as to obtain an estimate of the differential input voltage, but also to control the voltages TopP and TopN such that they tend towards the bias voltage, Vbias, that was used during the sampling phase onto the switched capacitor arrays. By allowing the arrays to be independently controlled the voltage difference between both the output nodes of the arrays and the bias voltage can be varied, although not necessarily in a monotonic fashion, to reduce this voltage as the SAR conversion is performed. By reducing the voltage, the charge transfer with the parasitic capacitances becomes progressively reduced as the conversion processes and consequently overall confidence in the end result can be increased.

FIG. 3 shows the range of differential and common mode inputs able to be accommodated by converters constituting embodiments of this invention. In typical differential input circuits, the maximum permissible range of either input is generally bounded by the power supply voltages of the circuit, or perhaps by the bounds of an applied reference voltage against which the inputs are to be compared. We shall assume the two inputs, VinP and VinN, are only valid when existing between the limits imposed by the positive reference voltage, VrefP and the negative reference, VrefN. The differential voltage, Vdiff, is defined as being equal to VinP−VinN and the common mode voltage, Vcm, is defined as being equal to (VinP+VinN)/2. In addition, the reference voltage, Vref, is defined as being equal to VrefP−VrefN. For simplicity, we shall assume that VrefN=0 and therefore both VinP and VinN are only valid in the range 0 to Vref.

With reference to FIG. 3, we can see that when the common mode of the inputs is Vref/2 the maximum differential range of the inputs can vary between Vdiff=Vref−0 to Vdiff=0−Vref i.e. a range of 2*Vref. Such an input range fed into an ADC converting with respect to Vref will yield converter results between its positive and negative full scale values. If the inputs are to remain within their valid range and the common mode is then either reduced or increased from Vref/2, then it can be seen that the maximum differential input range is correspondingly reduced. In the limit when the common mode voltage is either 0 or Vref there is no further valid range for either signal to develop a differential voltage greater than zero. Consequently, a differential input ADC will only be able to achieve positive and negative full scale results for signals with a common mode voltage in the middle of its range, namely Vref/2.

FIG. 4 schematically shows a circuit diagram for an ADC 400 constituting an embodiment of the present invention. For simplicity components which appeared in FIG. 1 will be designated with the same reference number. Six bits have been chosen to keep this example short, although in practice this technique can be used with any number of bits, e.g. 16 or 18. It can be seen, comparing this with the prior art diagram of FIG. 1, that the comparator 12 is modified to accept an additional input 28 and to produce an additional output, OUT2, such that the outputs are responsive to both the differential and common mode components of its inputs. The digital controller 40 is modified to accommodate the additional comparator outputs and produce independent SARP and SARN bus outputs to control the DACs. The rest of the circuit is unmodified. Note that instead of having a multi-function comparator with additional inputs and outputs, a multiplicity of regular two-input, single-output comparators can be used to achieve the same purpose. The additional comparator input, labelled "0" in FIG. 4, is the intended DAC common mode output reference voltage for the comparator's differential inputs. It would typically be connected to Vbias (which could be any suitable voltage, including ground), although it could also be connected to other sources, for example a variable voltage, TopRef 26, that asymptotes to Vbias. Any modification required to implement this invention can be limited to changes made within the comparator 12, or the inclusion of additional comparators, together with modifications to the operation of the SAR algorithm under the control of a SAR controller 40. The controller 40 has switch control busses 42 and 44 for controlling the switches in the positive switched capacitor array DACP and the negative switched capacitor array DACN independently of one another.

To understand the operation of the invention, it is worth considering how the present invention deals with converting the input voltages which were previously considered in the examples shown on FIGS. 2A to 2C. FIGS. 5A to 5C illustrate examples of such operation. As previously described in the BACKGROUND OF THE INVENTION section, FIGS. 2A to 2C, depict operation with a fixed reference voltage, Vref, bias voltage, Vbias, and differential input voltage, Vdiff, with an ideally expected 6-bit differential conversion result, from MSB to LSB, of "001100". Within each figure, only the common mode component of the input voltage is varied, namely from 2.5V to 3V to 1.5V. The prior art technique illustrated in FIG. 2A performs accurately because the top plate voltages present at the sampling instant equals the top plate voltages present at the end of the conversion. This condition satisfies the requirements that the deleterious top plate parasitic capacitors have not taken or given any charge to the capacitor DACs which therefore contain all the charge sampled from the input. In FIGS. 2B and 2C, where the top plate voltages present at the end of the conversion do not match Vbias, there will be subsequent errors in the conversion results.

The basic premise behind this invention is that the SARP and SARN busses driving the DAC switches can be set independently such that the differential voltage between the top plates is converged towards zero, as is the case with the prior art, but in addition the common mode voltage of the top plates is converged towards Vbias. In this manner, an accurate result is always achieved because the parasitic capacitors present on the top plates are always discharged back to Vbias as previously explained.

Before comparing FIG. 2 with FIG. 5, note in FIG. 2 that once the SAR process begins we observe the classic relationship between the SARP and SARN busses in that they are related, in this case they are complements of each other. The algorithm used starts with both SAR busses effectively set to mid-scale i.e. SARP="1000000" and SARN="0111111". If TopP≧TopN then the algorithm decides, when progressing from one bit weight trial to the next, to reduce TopP and equally increase TopN simply by decreasing the numeric value of SARP and increasing the numeric value of SARN. Conversely, if TopP<TopN then the algorithm decides to increase TopP and equally decrease TopN simply by increasing the numeric value of SARP and decreasing the numeric value of SARN. For general simplicity, the SAR controller of FIG. 2 typically only concerns itself with SARP, and SARN is derived by simply inverting SARP. In this manner, SARP and SARN always move identically in opposite directions. This technique, and the resultant waveforms shown in FIG. 2, are well understood by those skilled in the art.

If we consider this more carefully we see that, in a 6 bit example, an additional terminating capacitor is included such that the binary weighted capacitors sum to a value C. In this example $2^6$=64, so the relative weights of the capacitors are C1=32, C2=16, C3=8, C4=4, C5=2, C6=1 and C7=1.

At bit trial 1, SARP=100000 and SARN=011111. The terminating capacitor, C7, in DACP is set to 0 and the terminating capacitor, C7, in DACN is set to 1, so that each SAR BUS commences with an identical mid-scale weight of 32, as set out in Table 1. Because the terminating capacitors are not controlled by the SAR algorithm and never change state, only the the top 6 bits of SARP and SARN are controlled for a 6 bit converter. It is proper to only consider 6 bit SAR data for the purposes of algorithm details. A key point to bear in mind is that because the terminating capacitor in DACN is always a "1", i.e. connected to Vref, the numeric value of the 6 bit SARN bus is always one greater than the binary SARN bus value would indicate. For further clarification, SARP=100000=32 and SARN=011111=31 but because DACN's terminating capacitor (which has the same weight as an LSB) is also a "1" the value of SARN is increased from 31 to 32.

TABLE 1

| Bit Trial | Diff. | SAR Bus Values | | P ≧ N | P − N |
|---|---|---|---|---|---|
| 1: SARP |  | 32 | 100000 | 1 | 0 |
| SARN |  | 32 | 011111 |  |  |
| 2: SARP | −16 | 16 | 010000 | 1 | −32 |
| SARN | +16 | 48 | 101111 |  |  |
| 3: SARP | −8 | 08 | 001000 | 0 | −48 |
| SARN | +8 | 56 | 110111 |  |  |
| 4: SARP | +4 | 12 | 001100 | 0 | −40 |
| SARN | −4 | 52 | 110011 |  |  |
| 5: SARP | +2 | 14 | 001110 | 1 | −36 |
| SARN | −2 | 50 | 110001 |  |  |
| 6: SARP | −1 | 13 | 001101 | 1 | −38 |
| SARN | +1 | 51 | 110010 |  |  |

Referring to both FIG. 2 and Table 1, at the end of the bit 1 trial, TopP is greater than TopN so the algorithm reduces the value of SARP by half of a bit 1 weight, i.e. 16, and correspondingly increases the value of SARN by half of a bit 1 weight, i.e. 16, in preparation for the bit 2 trial. The total differential change for bit trial #1 is therefore a bit 1 weight i.e. 32. The SAR bus weight changes from one bit trial to the next are shown in the "Diff" column of Table 1, and the resultant SARP and SARN bus values (in both decimal and binary) are shown in the "SAR Bus Values" column. This weight change is conventionally described as discarding (re-setting) the first bit and setting the second bit—for the P array. Thus the weight of the SARP bus for bit trial 2 is 16 (010000) whereas the weight for the SARN bus is 48 (101111).

At the comparison stage of the bit 2 trial, TopP is greater than TopN so the algorithm subtracts half of a bit 2 weight, i.e. 8, from the SARP to get 16−8=8 whereas the equivalent weight is added to SARN to get 48+8=56 for the bit 3 trial.

At the comparison stage of the bit 3 trial, TopP is less than TopN so SARP is increased by half of a bit 3 weight, i.e. 4, to give 8+4=12, whereas SARN is decreased to give 56−4=52 for the bit 4 trial.

At the comparison stage of the bit 4 trial, TopP is less than TopN so SARP is increased by half of a bit 4 weight, i.e. 2, to give 12+2=14, whereas SARN is decreased to give 52−2=50 for the bit 5 trial.

At the comparison stage of the bit 5 trial, TopP is greater than TopN so SARP is decreased by half of a bit 5 weight, i.e. 1, to give 14−1=13, whereas SARN is increased to give 50+1=51 for the bit 6 trial.

At the comparison stage of the bit 6 trial, TopP is greater than TopN and so the comparator produces the result of the $6^{th}$ and final bit trial for this 6 bit converter. There is no further need to adjust the SARP and SARN busses. The difference between the SAR words, −38 in this example, represents the conversion result.

Because this invention involves the independent manipulation of the SARP and SARN busses, the beginning of the SAR cycles need not necessarily begin with SARP="100000"=32 and SARN="011111"=32 (because the terminating capacitor in SARN is a 1). They could equivalently begin with SARP=SARN="1000000"=32 (both terminating capacitors set to 0), however for the purposes of simplicity the SAR busses shown in FIG. 5 will commence with the same SAR words as in FIG. 2. In this way, all corresponding waveforms across FIGS. 2 and 5 will commence their conversions with identical SAR busses and top plate voltages in bit trial #1.

The description of the operation of a first embodiment of this invention will focus on the algorithm implemented in the SAR controller which adjusts the common mode of the top plate voltages towards Vbias. From a differential convergence perspective, nothing new is presented here i.e. the differential relationships between the top plate voltages are derived according to presently established SAR algorithms. It is therefore instructive to observe that although every waveform shown within FIGS. 2 and 5 may appear quite different, the actual difference between TopP and TopN at each point during the SAR bit trials is identical. All of the innovation in this embodiment pertains to manipulating the common mode voltage of the top plates at each bit trial by shifting them up or down together, and so maintaining their difference, such that the two top plates also converge towards Vbias as the bit trials progress. The information required to direct the top plates towards Vbias with each bit trial is provided by the comparator which has been modified to accept an additional input typically connected to Vbias. It is also noteworthy that the final digital answer for the differential conversion is no longer the number present in the SARP bus as with the prior art. Using this invention, by the end of the conversion both SAR busses may contain decidedly different numbers and the differential answer cannot be determined from any one of them. The simplest way to derive the conversion result is to take the difference between the SARP and SARN busses. Note that this method also works for the prior art.

At the end of each bit trial we detect, through use of the modified comparator, if the common mode of the top plates is bigger or smaller than TopRef 26 and so modify the SAR busses in a common mode manner for the next SAR cycle. For all subsequent descriptions, we shall assume that TopRef is connected to Vbias and the two names may be used interchangeably. The first common mode SAR bus correction is applied during bit trial #2 and has (in this example) a magnitude of Vref/4, accomplished by adding or subtracting "010000" or 16 to both SAR busses. The process is repeated for the next bit trial whereby a correction of Vref/8 is implemented, accomplished by adding or subtracting "001000" or 8 to both SAR busses. This is similarly repeated for all the bit trials in conjunction with the differential SAR algorithm. The maximum magnitude of the common mode correction would be Vref/4+Vref/8+Vref/16 and so on. This sum equals Vref/2 which was the previously determined largest common mode voltage correction permissible. In the SAR bus domain, the equivalent sum is 100000=010000+001000+000100 and so on. In the numeric domain, the equivalent sum is 32=16+8+4 and so on.

If we look at the modified operation of a SAR ADC constituting an embodiment of the present invention we can see that the differential or bit trial part of the algorithm remains unaltered, but that the process now depends on whether the voltage of TopP is greater than the voltage on TopN, and also whether the top plate common mode voltage is greater than Vbias.

Referring to FIG. 5*a* and to table 2, we see that the first DAC trial word is conventional thus, if for simplicity we consider a six bit converter as was considered with respect to FIGS. 2, then the first trial sets the weight of SARP to 32 (100000) and the weight of SARN to 32 (011111 plus the terminating capacitor). At the end of the first bit trial we see that the voltage on TopP is greater than or equal to the voltage on TopN, so the differential algorithm moves to subtract half of a bit 1 weight, i.e. 16, from the value of SARP and to add 16 to the value of SARN. However in accordance with the present invention a common mode correction is also made. Here at the end of the first bit trial we see that the common mode voltage was greater than or equal to the bias voltage so a common mode correction will be made in which the value on SARP and the value on SARN is decreased by 16. Taking both of these changes in account then the value on SARP is 32−16−16=0 whereas the value on SARN is 32+16−16=32 for the second bit trial.

At the comparison stage of the bit 2 trial, we see that TopP is greater than or equal to TopN, but now the common mode voltage is not greater than or equal to Vbias. Consequently the differential part of the algorithm acts to subtract half of a bit 2 weight, i.e. 8, from SARP and to add 8 to SARN. Meanwhile the common mode part of the algorithm seeks to add a weight corresponding to half of a bit 2 weight, (discard bit 2 and set bit 3) i.e. 8, to both SARP and SARN. Therefore the bit 3 trial SARP will become 0−8+8=0, whereas the weight on SARN will become 32+8+8=48.

At the comparison stage of the bit 3 trial we see that TopP is less than TopN and that the common mode voltage is not equal to or greater than Vbias. Given that TopP is less than TopN the differential part of the algorithm seeks to increase the value on SARP and to decrease the value on SARN by half of a bit 3 weight, i.e. 4. Simultaneously the common mode part of the algorithm will increase the value on SARP and SARN by 4. Therefore the bit 4 trial SARP will become 0+4+4=8 whereas SARN will become 48−4+4=48.

At the comparison stage of the bit 4 trial we see that TopP is less than TopN so the differential part of the algorithm will seek to increase the value on SARN and to decrease the value on SARN by half the current bit weight, i.e. 2. Meanwhile the common mode voltage is not greater than or equal to the bias voltage so the common mode part of the algorithm will seek to increase the value on SARN and SARP by half the current bit weight, i.e. 2. Therefore the bit 5 trial SARP will have a value of 8+2+2=12 units whereas SARN will have a value of 48−2+2=48 units.

The process is then continued for the rest of the bit trial, and as shown in Table 2. With reference to FIGS. 5B and 5C, it can be seen that the same pattern of decision making is set out with regards to tables 3 and 4. In each example, including the prior art, the output from the differential part of the comparator, shown under the "P-N" column in each table, follows the same pattern and can be kept to derive the conversion result.

TABLE 2

| Bit Trial | Diff. | CM | SAR Bus Values | | P ≧ N | CM ≧ Vbias | P − N |
|---|---|---|---|---|---|---|---|
| 1: SARP |  |  | 32 | 100000 | 1 | 1 | 0 |
| SARN |  |  | 32 | 011111 |  |  |  |
| 2: SARP | −16 | −16 | 0 | 000000 | 1 | 0 | −32 |
| SARN | +16 | −16 | 32 | 011111 |  |  |  |
| 3: SARP | −8 | +8 | 0 | 000000 | 0 | 0 | −48 |
| SARN | +8 | +8 | 48 | 101111 |  |  |  |
| 4: SARP | +4 | +4 | 8 | 001000 | 0 | 0 | −40 |
| SARN | −4 | +4 | 48 | 101111 |  |  |  |
| 5: SARP | +2 | +2 | 12 | 001100 | 1 | 0 | −36 |
| SARN | −2 | +2 | 48 | 101111 |  |  |  |
| 6: SARP | −1 | +1 | 12 | 001100 | 1 | 0 | −38 |
| SARN | +1 | +1 | 50 | 110001 |  |  |  |

TABLE 3

| Bit Trial | Diff. | CM | SAR Bus Values | | P ≧ N | CM ≧ Vbias | P − N |
|---|---|---|---|---|---|---|---|
| 1: SARP |  |  | 32 | 100000 | 1 | 0 | 0 |
| SARN |  |  | 32 | 011111 |  |  |  |
| 2: SARP | −16 | +16 | 32 | 100000 | 1 | 1 | −32 |
| SARN | +16 | +16 | 64 | 111111 |  |  |  |
| 3: SARP | −8 | −8 | 16 | 010000 | 0 | 1 | −48 |
| SARN | +8 | −8 | 64 | 111111 |  |  |  |
| 4: SARP | +4 | −4 | 16 | 010000 | 0 | 0 | −40 |
| SARN | −4 | −4 | 56 | 110111 |  |  |  |
| 5: SARP | +2 | +2 | 20 | 010100 | 1 | 0 | −36 |
| SARN | −2 | +2 | 56 | 110111 |  |  |  |
| 6: SARP | −1 | +1 | 20 | 010100 | 1 | 0 | −38 |
| SARN | +1 | +1 | 58 | 111001 |  |  |  |

TABLE 4

| Bit Trial | Diff. | CM | SAR Bus Values | | P ≧ N | CM ≧ Vbias | P − N |
|---|---|---|---|---|---|---|---|
| 1: SARP |  |  | 32 | 100000 | 1 | 1 | 0 |
| SARN |  |  | 32 | 011111 |  |  |  |
| 2: SARP | −16 | −16 | 0 | 000000 | 1 | 0 | −32 |
| SARN | +16 | −16 | 32 | 011111 |  |  |  |
| 3: SARP | −8 | +8 | 0 | 000000 | 0 | 1 | −48 |
| SARN | +8 | +8 | 48 | 101111 |  |  |  |
| 4: SARP | +4 | −4 | 0 | 000000 | 0 | 1 | −40 |
| SARN | −4 | −4 | 40 | 100111 |  |  |  |
| 5: SARP | +2 | −2 | 0 | 000000 | 1 | 0 | −36 |
| SARN | −2 | −2 | 36 | 100011 |  |  |  |
| 6: SARP | −1 | +1 | 0 | 000000 | 1 | 0 | −38 |
| SARN | +1 | +1 | 38 | 100101 |  |  |  |

Another equivalent way to describe this algorithm is the following: At the end of every bit trial, perform the full differential convergence using only the SAR bus whose corresponding top plate voltage is the furthest from Vbias. This operation can be readily observed in all the waveforms of FIG. 5.

Another variation of this algorithm might be that the applied common mode adjustment to both SAR busses at each bit trial may be a little more than the previously described example such that there is some overlap of common mode adjustments. This overlap can be used to correct errors in the common mode voltage adjustments with respect to Vbias made in previous bit trials. Alternatively it may be less than previously described so that the common mode value converges towards but does not quite obtain the value of the bias.

Many other algorithms are also possible. For example, the TopRef comparator input 28 shown in FIG. 4 need not necessarily be connected directly to Vbias. Instead, it may be connected to a variable voltage that follows a desired or advantageous trajectory towards Vbias with the intention of steering the common mode of the top plates through a region of optimized operation for the comparator. For example, the comparator may be optimized to work for input common mode voltages greater than or equal to Vbias, but not below Vbias.

As is the case with other SAR ADC architectures, such as that described in "U.S. Pat. No. 6,667,702", it is possible for this converter to make a critical decision, whereby the comparator is required to resolve the difference between two essentially identical inputs, when the top plate common mode voltage is substantially different to Vbias. During this decision, the previously mentioned parasitic capacitors have stolen input charge from the capacitor DACs and so that decision has been corrupted. Fortunately, error correction techniques, such as SAR redundancy, can be applied to fully recover that error. The redundancy technique creates yet another critical decision later in the SAR process, but that critical decision will occur with the top plate conditions being essentially the same as those during sampling. Error correction techniques involving redundancy are well-known in the art and are described, for example, in K. Bacrania, 'Digital Error Correction to Increase Speed of Successive Approximation', IEEE ISSCC Vol. 29, pp 140-141, Feb. 1986 and the subsequent U.S. Pat. No. patent 'Method for Successive Approximation A/D Conversion' by Cooper et al., 4,620,179 Oct. 28, 1986, which are herein incorporated by reference in their entirety.

The magnitude of the error introduced by performing a critical decision at a top plate common mode voltage other than Vbias is dependent on the magnitude of the deviation from Vbias and also the magnitude and linearity of the parasitic capacitors. As the suitably error corrected top plate common mode voltage converges towards Vbias with successive bit trials, the accuracy called for by the ADC differential measurement system may no longer necessitate the need for common mode correction after a certain bit trial. After this point, the use of the common mode convergence algorithm is no longer necessary. However, the ADC system is capable of determining the input signal common mode value to it's full precision if required. In such cases the common mode convergence algorithm will need to be run up to the final bit trial. Note also that if the full accuracy common mode voltage is not required as an ADC output, then the additional circuitry in the comparator to detect the top plate common mode voltage need not be as accurate as the portion of the comparator dedicated to the differential signal path.

In the description so far, we have described a situation where the differential part of the SAR algorithm has always been conventional, that is a bit trial has worked through the MSB to the LSB and a decision has been taken whether to keep or discard the most recently trialled bit weight. In conjunction with this process we have been performing a common mode correction to the values of the SAR busses.

The next embodiment to be described uses a modified differential scheme. In particular a differential bit trial does not necessarily happen at every stage of the SAR conversion.

In the description that follows in relation to FIGS. 6a to 6c we will describe a scheme where, for simplicity, the SAR algorithm controller is either performing a common mode correction at a trial step or is performing a differential correction at a trial step, but not both at the same time. It should be stressed that this is merely for the purposes of explaining the new scheme and that some trial steps in an actual implementation may include a mixture of common mode and differential correction—as has been described hereinbefore with respect to FIGS. 5a to 5c, or that some trial steps are differential only in their nature.

In a further refinement, the circuit of FIG. 4 is defined such that OUT1 is "1" if TopP≧TopRef, and is "0" if TopP<TopRef, and OUT2 is "1" if TopN≧TopRef, and is "0" if TopN<TopRef. The algorithm used by the controller 40 is modified such that either a differential or a common mode convergence is performed. The key aspect here is that the controller can now determine if both top plate voltages have the same sign with respect to TopRef which generally equals Vbias (so the term Vbias will be used for simplicity) i.e. they are both greater than or both less than Vbias. At any given SAR cycle, the differential correction is twice that of the common mode correction. Therefore, if both TopP and TopN are e.g. greater than Vbias, then the difference between them must be less than or equal to half of the differential correction range i.e. something the next SAR cycle (whose correction magnitudes are halved) can correct, and so the differential decision is deferred to the next SAR cycle. However, because we know both top plates are greater than Vbias, we still perform a common mode correction by reducing both SAR busses by the common mode value corresponding to that bit weight. Hence this algorithm produces differential convergence when the top plates straddle Vbias, and common mode convergence when the top plates are on the same side (in terms of voltage) of Vbias. An additional benefit of this approach is that critical decisions (where the top plate voltages are essentially the same) are stalled until the common mode voltage of the top plates is also very near Vbias. This dramatically reduces the need for error correction (e.g. SAR redundant bits) because no critical decisions are performed at voltages where the non linear top plate parasitic capacitors are charged to anything other than Vbias.

The practical advantage of avoiding critical decisions until the common mode voltage of the top plates is near the Vbias is immense. In the prior art, comparators may have to make such critical decisions with voltages spanning nearly the entirety of the potential conversion range of the converter. Whilst this would cause no difficulty for the ideal comparator, real world comparators tend to have zones where they work very well, and some zones where they work less well. Indeed it is known that some comparators may have trouble correctly determining the relative sizes of two voltages even when those voltages are separated by a significant amounts, such as several tenths of a volt, when the common mode value at the input of the comparator is close to the comparator's supply voltage. Thus incorrect critical decisions are, rather than being a theoretical possibility, a nigh on certainty. However if the SAR algorithm is modified such that critical decisions only ever occur within a well defined voltage range of the inputs to the comparator then the comparator can be optimized for this particular voltage range and hence the number of incorrect critical decisions is significantly reduced. This in turn reduces the number of error correction/redundant bits that are required for reliable operation, which in itself allows to an increase in the conversion rate of the ADC.

As noted above, the operation of the revised scheme can be summarised as performing a common mode correction if both TopP and TopN are the same side (i.e. above or below) of the top plate reference voltage, and performing a differential correction if the top plate reference voltage lies between the voltages on TopP and TopN.

This modified algorithm will be described with reference to FIGS. 6a to 6c where the examples chosen correspond identically to those shown in FIGS. 2 and 5. The comparator output at each stage of the conversion cycle is indicated in FIGS. 6a to 6c by two digits, each of which can be either one or zero, for that comparison step. The first digit is zero if TopP is less than Vbias and one if TopP is greater than or equal to Vbias. The second digit is zero if TopN is less than Vbias and one if TopN is greater than or equal to Vbias.

It can be seen in FIG. 6a that the top plate common mode voltage is equal to the bias voltage Vbias at 2.5 volts. Therefore, in this particular special case, the bias voltage always lies between the top plate voltages at each and every comparison step. The trial process will be described, with reference to table 5, which summarises it. Sticking once again with a six bit example for simplicity, the trial commences at step 1 with SARP being set to 100000 and SARN being set to 011111 such that, when taking the terminating capacitor into account, each SAR bus has a value of 32. At the end of the first trial we see that TopP is greater than Vbias and TopN is less than Vbias, and consequently TopN is less than TopP, so the first bit weight is discarded and the second most significant bit weight is added. Thus the value on SARP is now equal to 16 and the value on SARN has increased to 48 for the second SAR cycle. Once again the comparator concludes that TopP is greater than Vbias and TopN is not greater than Vbias, and consequently TopN is not greater than TopP, so the second bit weight is discarded and the third bit weight is set. This means when moving from the second bit trial to the third bit trial the value on SARP has been reduced by 8 to 8, and the value on SARN has been increased by 8 to 56. At the third bit trial we see that TopP is less than Vbias and the voltage on TopN is greater than Vbias, and consequently TopN is greater than TopP, so the third bit weight is kept. For the fourth bit trial the fourth bit weight is set so the value on SARP becomes 12 and the value on SARN becomes decreased by the weight of the fourth bit, such that it now becomes 52. The comparator once again determines that TopP is not greater than Vbias and that TopN is greater than Vbias so the fourth bit weight is kept. The process is then continued for the fifth and sixth bits. It can be seen with reference to FIG. 5 that each bit trail only involved a differential change to the SAR values because at no stage were both of the SAR values either above or below the top plate reference voltage.

TABLE 5

| Bit Trial | Diff. | CM | SAR Values | | TopP ≥ Vbias | TopN ≥ Vbias | SARP − SARN |
|---|---|---|---|---|---|---|---|
| 1: SARP |  |  | 32 | 100000 | 1 | 0 | 0 |
| SARN |  |  | 32 | 011111 |  |  |  |
| 2: SARP | −16 | 0 | 16 | 010000 | 1 | 0 | −32 |
| SARN | +16 | 0 | 48 | 101111 |  |  |  |
| 3: SARP | −8 | 0 | 08 | 001000 | 0 | 1 | −48 |
| SARN | +8 | 0 | 56 | 110111 |  |  |  |
| 4: SARP | +4 | 0 | 12 | 001100 | 0 | 1 | −40 |
| SARN | −4 | 0 | 52 | 110011 |  |  |  |
| 5: SARP | +2 | 0 | 14 | 001110 | 1 | 0 | −36 |
| SARN | −2 | 0 | 50 | 110001 |  |  |  |
| 6: SARP | −1 | 0 | 13 | 001101 | 1 | 0 | −38 |
| SARN | +1 | 0 | 51 | 110010 |  |  |  |

FIG. 6b now shows a situation where the differential voltage is the same as it was in FIG. 6a but that the common mode voltage is now shifted to three volts. It will be described in conjunction with Table 6.

TABLE 6

| Bit Trial | Diff. | CM | SAR Values | | TopP ≥ Vbias | TopN ≥ Vbias | SARP − SARN |
|---|---|---|---|---|---|---|---|
| 1: SARP |  |  | 32 | 100000 | 1 | 0 | 0 |
| SARN |  |  | 32 | 011111 |  |  |  |
| 2: SARP | −16 | 0 | 16 | 010000 | 0 | 0 | −32 |
| SARN | +16 | 0 | 48 | 101111 |  |  |  |
| 3: SARP | 0 | +8 | 24 | 011000 | 1 | 0 | −32 |
| SARN | 0 | +8 | 56 | 110111 |  |  |  |
| 4: SARP | −4 | 0 | 20 | 010100 | 1 | 1 | −40 |
| SARN | +4 | 0 | 60 | 111011 |  |  |  |
| 5: SARP | 0 | −2 | 18 | 010010 | 0 | 1 | −40 |
| SARN | 0 | −2 | 58 | 111001 |  |  |  |
| 6: SARP | +1 | 0 | 19 | 010011 | 0 | 0 | −38 |
| SARN | −1 | 0 | 57 | 111000 |  |  |  |

The trial starts conventionally with the values on SARP and SARN being set to half full scale, that is 32 each. At the end of the first bit trial the comparator notes that the value of TopP is greater than Vbias and the value on TopN is less than Vbias. Therefore TopN is less than TopP and the first bit weight is discarded such that, when moving from the first bit trial to the second bit trial the value on SARP is reduced by the second bit weight (i.e. first bit weight discarded and second bit weight set) and the value on SARN is increased by the second bit weight so as to have numeric values of 16 and 48 respectively in this example. At the second bit trial both TopP and TopN are determined to be less than Vbias. Now, crucially, when advancing from the second bit trial to the third bit trial the differential convergence part of the algorithm is suspended and instead a weight corresponding to the third bit weight is added to both of the SAR busses such that SARP has a value of 24 and SARN has a value of 56. During the third bit trial TopP is found to be greater than Vbias and TopN is less than Vbias, and consequently because the bias voltage falls between the top plate voltages the differential convergence part of the algorithm is re-enabled when moving from the third bit trial to the fourth bit trial. It should be noted that at the end of the third bit trial TopP was greater than TopN and hence the weight of the third bit is discarded from SARP and the weight of the fourth bit is added to SARP when moving from the third to the fourth bit trail such that, overall, the value of SARP reduces from 24 to 20 for the fourth bit trial and, following the same logic, the value of SARN increases from 56 to 60 for the fourth bit trial. At the comparison state of the fourth bit trial it can be seen that both TopP and TopN are greater than Vbias so once again the differential part of the algorithm is suspended and instead the weight of the fifth bit weight is now subtracted from both SARP and SARN, such that SARP becomes 18 and SARN becomes 58. It can be seen at the comparison stage of the fifth bit trial that TopN is above Vbias and TopP is below Vbias and consequently the differential mode is re-enabled and the fifth bit weight is also kept such that, when advancing from the fifth bit trial to the sixth bit trial, the value of SARP is incremented by the weight of the sixth bit and the value SARN is decremented by the weight of the sixth bit to give values 19 and 57 respectively.

When comparing FIG. 6b with FIG. 6a we see that over the six bit trials the voltages on TopP and TopN have both achieved values very similar to Vbias and that although the bit weights on the SAR busses are different, the difference between SARP and SARN is the same at −38, which represents the conversion result.

A similar pattern can be seen for FIG. 6c in combination with Table 7.

value on SARN becomes 48. It can be seen at the second bit trial that both TopP and TopN are greater than Vbias so differential approximation is suspended and common mode correction is enabled with the weight of the third bit being subtracted from both SARP and SARN for the third bit trial, giving values of 8 for SARP and 40 for SARN. At the end of the third bit trial it can be seen that both TopP and TopN are still greater than Vbias so differential correction is once again suspended and common mode correction is once again performed by subtracting the weight of the fourth bit from both SARP and SARN such that SARP has a value of 4 and SARN has a value of 36. It can be seen that this results in the fourth bit trial occurring with TopN being less than Vbias and TopP being greater than Vbias. Consequently common mode correction is suspended and differential correction is performed with the value of SARP being reduced by the weight of the fifth bit, i.e. from 4 to 2, and the value of SARN being increased by the weight of the fifth bit i.e. from 36 to 38. At the decision time for the fifth bit we still see that TopP is greater than Vbias and TopP is less than Vbias so differential correction is performed once more with the value of SARP being reduced by the weight of the sixth bit and the value of SARN being increased by the weight of the sixth bit to have values of 1 and 39 respectively. This represents the end of the conversion. Once again we can see that both the top plate voltages have converged towards Vbias and that although the values on the SAR busses are different to the values shown in Tables 5 and 6 the difference between shown in SARP minus SARN is equal to −38, as before. Thus this represents the output from the ADC.

Thus the decision to either perform common mode correction when Vbias does not lie between the voltages on TopP and TopN, and to perform differential correction when Vbias does lie between TopP and TopN provides a scheme where convergence and conversion can still be achieved in an expected number of bit trials, i.e. six bit trials for a six bit answer, twelve bit trials for a twelve bit answer, sixteen bit trials for a sixteen bit answer and so on, but where critical decisions concerning the relative values on TopN and TopP are only made when both TopN and TopP are close to the top plate reference voltage. Thus the comparator could be opti-

TABLE 7

| Bit Trial | Diff. | CM | SAR Values | | TopP ≧ Vbias | TopN ≧ Vbias | SARP − SARN |
|---|---|---|---|---|---|---|---|
| 1: SARP | | | 32 | 100000 | 1 | 0 | 0 |
| SARN | | | 32 | 011111 | | | |
| 2: SARP | −16 | 0 | 16 | 010000 | 1 | 1 | −32 |
| SARN | +16 | 0 | 48 | 101111 | | | |
| 3: SARP | 0 | −8 | 08 | 001000 | 1 | 1 | −32 |
| SARN | 0 | −8 | 40 | 100111 | | | |
| 4: SARP | 0 | −4 | 04 | 000100 | 1 | 0 | −32 |
| SARN | 0 | −4 | 36 | 100011 | | | |
| 5: SARP | −2 | 0 | 02 | 000010 | 1 | 0 | −36 |
| SARN | +2 | 0 | 38 | 100101 | | | |
| 6: SARP | −1 | 0 | 01 | 000001 | 1 | 1 | −38 |
| SARN | +1 | 0 | 39 | 100110 | | | |

Here the common mode voltage is 1.5 volts. The first bit trial starts conventionally with the value on SARP and SARN being set to 32, respectively. Here we see at the end of the first bit trial that TopP is above Vbias and TopN is below Vbias so consequently common mode correction is not performed and differential correction is performed. As TopN is less than TopP the first bit weight is discarded and the second bit weight is set such that the value on SARP becomes 16 and the mised for use around the reference voltage and hence the intrinsic reliability of the comparison process is improved.

The present invention is suitable for use in any ADC architecture where charge transfer to parasitic components, for example the non-linear input capacitance of the comparator, is deleterious.

Figure 7C:
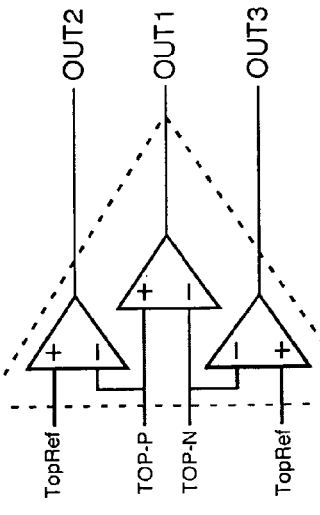
FIGS. 7a to 7e schematically illustrate alternative configurations within the comparator.
Figure 7B:
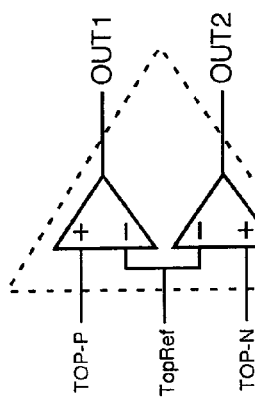
Figure 7A:
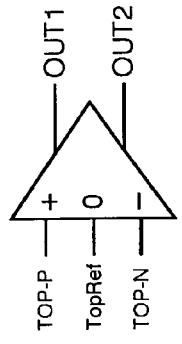
Figure 7E:
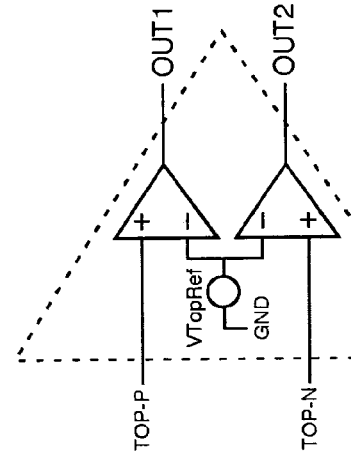
Figure 7D:
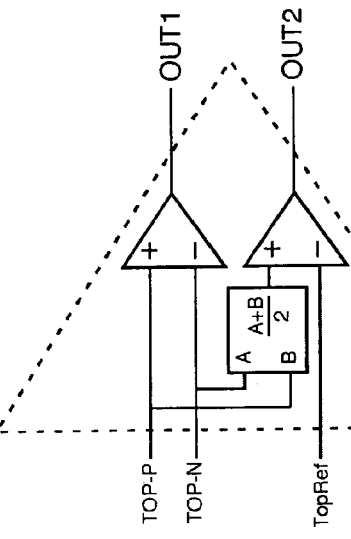

In the arrangement shown in FIG. 4 the comparator has been shown as having three inputs and two outputs, as shown once again in FIG. 7a. This functionality within the comparator can be provided in several alternative ways, as shown in FIG. 7b, 7d and 7e. The arrangement shown in FIG. 7d includes a voltage averaging circuit which would be easily produced by the person skilled in the art. It can also be seen that the reference input TopRef as shown in FIG. 4 could be internalised within the comparator as shown in FIG. 7e.

As a further alternative the comparator could provide three outputs indicating whether TopP is greater than the reference voltage (TopRef), whether TopN is greater than the reference voltage (TopRef) and whether TopP is greater than TopN. This once again provides all the information necessary for a SAR controller to implement the control strategies described herein.

Having thus described illustrative embodiments of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

The invention claimed is:

1. A Successive Approximation Routine (SAR) Analog to Digital Converter (ADC) having first and second Digital to Analog Converters (DACs) connected to a comparator, and a controller responsive to one or more outputs of the comparator for controlling trial words presented to the first and second DACs, and wherein the comparator is arranged to compare outputs of the first and second DACs or an average thereof with a DAC common mode output reference and the controller is adapted to apply a common mode offset to the DAC trial words in response to the comparator, and the size of the common mode offset is adjusted as the successive approximation conversion proceeds.

2. A SAR ADC as claimed in claim 1, in which a differential adjustment to the DAC trial words for the first and second DAC is made at each bit trial.

3. A SAR ADC as claimed in claim 1, in which, for at least one trial, if a common mode offset to the DAC trial words is applied then a differential adjustment is not made during the same bit trial.

4. A SAR ADC as claimed in claim 1, in which, for at least one bit trial, if a differential adjustment of the DAC trial words is made then a common mode offset adjustment is not made during the same bit trial.

5. A SAR ADC as claimed in claim 1, in which a change in a magnitude of the common mode offset decreases as the SAR conversion proceeds from the most significant bit to the least significant bit.

6. A SAR ADC as claimed in claim 5, in which the common mode offset is related to weight of the bit being trialled in a given bit trial.

7. A SAR ADC as claimed in claim 6, in which the common mode offset is smaller in magnitude than the voltage attributable to the weight of a bit being trialled.

8. A SAR ADC as claimed in claim 6, in which the common mode offset is larger in magnitude than the weight of the bit being trialled.

9. A SAR ADC as claimed in claim 6, where the common mode offset is equal to the weight of a bit being trialled.

10. A SAR ADC as claimed in claim 1, in which an estimate of a common mode voltage at the outputs of the first and second DACs is made by the comparator, and the estimate compared against the DAC output common mode reference voltage, the result of which is used by the controller to determine whether the offset is added or subtracted from the next DAC trial word.

11. A SAR ADC as claimed in claim 1, in which the comparator has a third input and the DAC common mode output reference voltage is provided to the third input of the comparator.

12. A SAR ADC as claimed in claim 1, in which the comparator is arranged to compare a common mode voltage of the outputs of the first and second DACs with the DAC output common mode reference voltage.

13. A SAR ADC as claimed 12, in which the common mode voltage is calculated as a function of the sum of a first output voltage (TopP), and a second output voltage (TopN).

14. A SAR ADC as claimed in claim 12, in which if the common mode voltage is less than the DAC output common mode reference voltage the common mode offset is added to the DAC trial words.

15. A SAR ADC as claimed in claim 12, in which if the common mode voltage is greater than the common mode reference voltage the offset is subtracted from the DAC trial words.

16. A SAR ADC as claimed in claim 12, wherein the DAC output common mode reference voltage is a voltage used during an acquisition or sampling phase of the ADC's operation.

17. A SAR ADC as claimed in claim 12, in which the DAC output common mode reference voltage is varied during the SAR conversion.

18. A SAR ADC having first and second DACs, a controller for controlling trial words presented to the DACs, and wherein a comparator is provided to compare each DAC output with respect to a reference and the controller is adapted to perform differential modification of the DAC trial words when the reference is intermediate the DAC output values and to perform instead a common mode modification of the DAC trial words when the reference is not intermediate the DAC output values.

19. A comparator for use in an ADC, the comparator having a first input for connection to an output of a first DAC, a second input for connection to an output of a second DAC and a third input for connection to a DAC output common mode reference voltage, and first and second outputs, wherein the comparator is adapted to compare a voltage at the first input with a voltage at the second input and to output the result of the comparison at the first output, and to compare a voltage at the third input with an average of the voltages at the first and second inputs and to output the result of the comparison at the second output.

20. A controller for a SAR ADC, wherein the controller is:
a) responsive to an input indicative of a comparison between a DAC output common mode reference voltage and a common mode voltage at outputs of first and second DACs controlled by the controller; or
b) responsive to a comparison of an output voltage of a first DAC with respect to a DAC output common mode reference voltage and to an output of a second DAC with respect to the DAC output common mode reference voltage;

and on the basis of the comparisons either adds or subtracts an offset to control words used to control the output of the digital to analog converters so as to cause the voltages at the output of the first and second DACs to tend towards the DAC output common mode reference voltage.

21. A differential SAR ADC comprising:
a first DAC having an output node connected to a first input of a comparator;
a second DAC having an output node connected to a second input of a comparator; and
a SAR conversion controller responsive to an output of the comparator, and adapted to control operation of the DACs, wherein
a detector is provided to determine during at least one SAR bit trial which of the first and second capacitor arrays has the larger voltage difference between its output node and a DAC output common mode reference voltage, and
the SAR controller is responsive to the detector and adapted to control the first and second DACs independently of one another, and keeps one of the first and second DACs unchanged for a bit trial based on the output of the detector at a preceding bit trial.

22. A method of performing an analog to digital conversion using a differential input SAR ADC having a first switched capacitor DAC array for sampling a signal at a first input of the converter and a second switched capacitor DAC array for sampling a signal at a second input of the converter, the method comprising advancing from an Nth trial to an (N+1)th trial by setting new DAC trial words, wherein the step of setting new DAC trial words comprises:
1) determining whether the bit weight trialled at the Nth trial is to be kept or to be discarded, a subsequent and
2) applying a common mode offset to the DAC trial words.

23. A method as claimed in claim 22, where the magnitude of the common mode offset is a function of a bit weight being trialled in the Nth trial.

24. A method as claimed in claim 22, where the sign of the offset for an (N+1)th bit trial is a function of the sign of a common mode voltage occurring at the outputs of the first and second arrays during an Nth bit trial.

25. A method of performing an analog to digital conversion using a differential input SAR ADC having a first switched capacitor array connected to a first input of the converter and an output connected to a first input of a comparator and a second switched capacitor array connected to a second input of the converter and an output connected to a second input of the comparator, said comparator further being responsive to a reference voltage, the method comprising the steps of advancing from a Nth bit trial to an (N+1)th bit trial by:
a) determining at the Nth bit trial whether the Nth bit weight is to be kept or to be discarded;
b) determining at the Nth bit trial which of the first switched capacitor array output and the second switched capacitor array output has a largest magnitude voltage difference with respect to the common mode reference voltage;
c) and, for whichever array has the largest voltage difference with respect to the common mode reference voltage modifying the DAC trial word presented on that array for the (N+1)th bit trial while keeping the other array unaltered from the Nth bit trial.

26. A method as claimed in claim 25, further comprising a step of:
d) applying a common mode offset to the DAC trial words presented to the first and second switched capacitor arrays.

27. A method as claimed in claim 26, in which the magnitude of the output common mode offset is a function of the Nth bit trial weight.

28. A method as claimed in claim 26, in which the sign of the common mode offset is a function of the common mode value of the signal as presented to the first and second inputs of the comparator.

29. A method of performing an analog to digital conversion using differential input SAR ADC having a first switched capacitor array connected to a first input of the converter and a second switched capacitor array connected to a second input of the converter, and where the first switched capacitor array and second switched capacitor array are connected to respective inputs of a comparator, and wherein during a plurality of SAR conversions a common mode offset is applied to the first and second switched capacitor arrays, where a change in the magnitude of the offset varies as a function of the bit trial weight being trialled in the SAR conversion.

30. A SAR ADC having first and second DACs, a controller for controlling trial words presented to the DACs, and wherein a comparator is provided to compare each DAC output with respect to a reference and the controller is adapted to perform differential modification of the DAC trial words when the reference is intermediate the DAC output values and to perform common mode modification of the DAC trial words when the reference is not intermediate the DAC output values, a change in the magnitude of the common mode modification decreasing as the SAR conversion proceeds from the most significant bit to the least significant bit.

* * * * *